(12) United States Patent
Nordin et al.

(10) Patent No.: US 12,169,215 B2
(45) Date of Patent: Dec. 17, 2024

(54) METHOD OF DETECTING A FAULT IN A PULSED POWER DISTRIBUTION SYSTEM

(71) Applicant: Panduit Corp., Tinley Park, IL (US)

(72) Inventors: Ronald A Nordin, Naperville, IL (US); Masud Bolouri-Saransar, Orland Park, IL (US); Paul W. Wachtel, Arlington Heights, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 18/422,730

(22) Filed: Jan. 25, 2024

(65) Prior Publication Data

US 2024/0159814 A1 May 16, 2024

Related U.S. Application Data

(63) Continuation of application No. 17/512,081, filed on Oct. 27, 2021, now Pat. No. 11,921,146, which is a continuation of application No. PCT/US2020/030910, filed on May 1, 2020.

(60) Provisional application No. 62/842,627, filed on May 3, 2019.

(51) Int. Cl.
*G01R 31/08* (2020.01)
*G01R 31/315* (2006.01)

(52) U.S. Cl.
CPC ......... *G01R 31/086* (2013.01); *G01R 31/315* (2013.01)

(58) Field of Classification Search
USPC ........................................................ 324/512
See application file for complete search history.

(56) References Cited

U.S. PATENT DOCUMENTS

| | | |
|---|---|---|
| 4,947,110 A | 8/1990 | Laass |
| 8,781,637 B2 * | 7/2014 | Eaves ............ H02J 3/12 700/286 |
| 9,184,795 B2 | 11/2015 | Eaves |
| 9,419,436 B2 | 8/2016 | Eaves et al. |
| 9,853,689 B2 | 12/2017 | Eaves |
| 9,893,521 B2 | 2/2018 | Lowe et al. |
| 10,468,879 B2 | 11/2019 | Eaves |
| 10,714,930 B1 | 7/2020 | Weiss et al. |
| 10,735,105 B2 | 8/2020 | Goergen et al. |
| 10,790,997 B2 | 9/2020 | Jones et al. |
| 2003/0146765 A1 | 8/2003 | Darshan et al. |
| 2009/0045818 A1 | 2/2009 | Male |
| 2013/0103220 A1 | 4/2013 | Eaves |
| 2017/0229886 A1 | 8/2017 | Eaves |

(Continued)

FOREIGN PATENT DOCUMENTS

EP 0360109 A1 3/1990

*Primary Examiner* — Farhana A Hoque
(74) *Attorney, Agent, or Firm* — Peter S. Lee; Christopher S. Clancy; James H. Williams

(57) ABSTRACT

A method of detecting a fault in a power distribution system includes placing a signal on the system at a frequency $F_1$ and then detecting a change in the signal due to a change in the impedance of the system as a result of a fault wherein the change is one of a change in phase, a change in signal tone, or a change in voltage level at the load. In one embodiment, band reject filters can be used to diminish the signal at the load or source. In another embodiment, the power source can be a periodic pulsed power source and the signal can be placed on the system during an idle phase of the periodic pulsed power.

20 Claims, 12 Drawing Sheets

(56) References Cited

U.S. PATENT DOCUMENTS

2018/0313886 A1 11/2018 Mlyniec et al.
2020/0295559 A1 9/2020 Eaves et al.

* cited by examiner

No Fault Case $Z_L = R_L / [1 + j\omega R_L C_L]$ $\phi_L = -\tan^{-1}[\omega R_L C_L]$ Fault Case $Z_L = R_T / [1 + j\omega R_T C_L]$ $\phi_L = -\tan^{-1}[1 + j\omega R_T C_L]$ $R_T = R_F \| R_F$ Phase as a function of Frequency

METHOD OF DETECTING A FAULT IN A PULSED POWER DISTRIBUTION SYSTEM

CROSS REFERENCE TO RELATED APPLICATIONS

This application is a continuation of U.S. Non-Provisional patent application Ser. No. 17/512,081, filed Oct. 27, 2021, which is a by-pass continuation of International Patent Application No. PCT/US2020/030910, filed May 1, 2020, which claims benefit to U.S. Provisional Patent Application No. 62/842,627 filed May 3, 2019, the entirety of all of which are hereby incorporated by reference herein.

FIELD OF THE INVENTION

The present invention relates generally to fault detection and more specifically to methods of fault protection in a pulsed power over ethernet distribution system.

BACKGROUND OF THE INVENTION

Network enabled client devices in an Enterprise environment require data (or control) connectivity and power to run the device. Traditionally, the data connectivity was served by copper LAN cabling (e.g., Cat 6 or Cat 6a) or by optical fiber LAN cabling (e.g., OM3, OM4, or OS2). The power to run the load device was typically provided by an AC outlet nearby. The IEEE standard body in 2002 completed a technology called Power over Ethernet (PoE) which combined the data communication with power at the source and safely transferred to the load. This DC power was superimposed on top of the data signals. The DC voltage was under 60V and the current was less than 2A. The advantage of this technique was the ability to avoid the installation cost of providing an AC outlet near the client devices and allowing the cabling to be installed safely (classified as SELV) by non-electricians. This technology has been successfully adopted in the industry. Some of the deficiencies of this technology is the ability to transfer power efficiently (e.g., having low losses in the cabling) and managing the large temperature rise over ambient when cabling is bundled. The root-cause of these disadvantages arises from the high current required for the power to be transferred using voltage under 60V. If the voltage were to be allowed, for example, to be increased by a factor of 10, the current would drop by a factor of 10 (for equal power transfer) and the power loss in the cabling would be dropped by a factor of 100 (note that power loss in the cabling is proportional to $I^2R$ where R is the resistance of the cable). Hence there is a desire for a technology where the voltage can be greatly increased (in order to transfer more power) and where the technology can be considered safe (where non-electricians can install the cabling). One method to increase the voltage safely is utilizing pulsed power technique. Here a high voltage (say 300-600V) is pulsed on for a millisecond or so and then pulsed back off and repeating in a periodic fashion. (note that this periodic pulse waveform can be represented as having an RMS voltage value which is the equivalent of a DC voltage when calculating power transfer). Before another high voltage pulse can be turned back on, the cabling is inspected to ensure that there is not a fault on the cable (where a fault can be a person touching the conducting wires). If this technique can meet the above requirement (i.e., that a fault cannot experience the high voltage for more than a millisecond or two), the technology can be considered safe and non-electricians can install the cabling. Another benefit of this new technology is that the wire gauge that is being used to transfer the power can utilize a much larger gauge wire (i.e., a smaller diameter wire), hence decreasing the cable size and lowering the material cost. A low data rate communication signal (for managing the power distribution) can also be super imposed onto the power signal in a variety of ways as well. The bandwidth of the data communications signal (embedded in the pulsed power waveform) is constrained between the power pulse period and the slew rate of the pulse itself. Data rates in the 10 kbps to 100 kbps can be easily supported.

The IEC-60950-1 (to be replaced by 62368-1) is a safety of information technology standard that defines and classifies the circuit type (i.e., ELV (extra low voltage), SELV (safety or separated extra low voltage), LCC (Limited Current Circuits) or TNV (telecommunications network voltages)). In order to be considered SELV or LCC, the output voltage of the electrical source equipment must be isolated from earth (e.g., transformer isolated), hence a single fault cannot create a risk of an electrical shock. Devices classified as SELV or LCC are considered safe and allow unrestricted access to operators and installers. The voltage for SELV status in accessible parts shall not exceed 42.4 Vac peak or 60 Vdc for longer than 200 ms. (An absolute limit of 71 Vac peak or 120 Vdc must not be exceeded.) SELV circuits must be separated from hazardous voltages by two levels of protection (e.g., double insulation or basic insulation with an earthed conductive barrier). The LCC classification is specified to ensure that under normal operation or under a single fault condition, the current that can be drawn is not hazardous. The voltage for the LCC classification (for personal accessible parts) shall not exceed 450 Vac peak or 450 Vdc, the maximum circuit capacitance allowed is 0.1 uF, and for personal accessible parts not exceeding 1500 Vac peak or 1500 Vdc the maximum stored charge allowed is 45 uC and the available energy shall not be above 350 mJ. For example, if the fault resistance is 2 kΩ and the voltage pulse was 400 Vdc, the current would be equal to 200 mA and the maximum time duration for the exposure=4.4 ms.

The equivalent DC voltage for the pulsed waveform is the rms voltage that is equal to Vp*SQRT(t1/T), where Vp is the pulsed voltage magnitude, T is the period of the signal and t1 is the pulse duration. In the example below as shown in FIG. 1, the rms voltage is calculated as Vrms=305*SQRT(1/1.5)=249V. The longer the period (i.e., 1.5 ms as shown in the figure) is, the lower the rms voltage is. Note that the power transfer to the load is equal to the rms voltage squared divided by the load resistance (assuming the distribution wiring has no resistance). The current in a 2 kΩ load is 125 mA rms at the rms voltage of 250V. The peak current in this example is 152.5 mA. The rms current can be used effectively for power transfer capability while the peak current can be used to determine the maximum exposure time to remain at a "safe" level. FIG. 2 shown below shows maximum exposure time (duration) will be given a current level. For example, using 152.5 mA peak current, the maximum time duration a human body can handle a voltage across the body of 305 V (leading to a peak current of 152.5 mA) safely is approximately 8 ms. FIG. 1 is a simple block diagram of a pulsed power distribution system (A). (B) shows a time domain view of the magnitude and time duration of the pulsed power and (C) shows the equivalent DC power delivered to the load (the rms value of the pulsed periodic signal of (B)). FIG. 2 shows a maximum exposure time to a power fault to a human body. For example, if one is exposed to a power source of 500 V (and using the body model of 2.0 kW which would result in a current of 250 mA), then as long as the exposure time duration was less than 3 ms it can be considered safe.

The advantage this pulsed power system has over that of PoE systems, is that the current level can be much lower and hence there will be less power drop across the cabling that is transporting this power (hence a greater efficiency of power transfer). As a further example of power transfer efficiency, let us assume we have a load that requires 75 W of power and it is desired that the power transfer efficiency be better than 10% (i.e., that cabling must absorb no more than 7.5 W). Assuming 24 AWG wire (84 mΩ/m) is used, what would the maximum cable length be for a PoE system (source voltage=60) and for a pulsed power system (source voltage=250 V rms). The PoE system could transmit power a distance of 47 m while the pulsed power system could transmit power a distance of 820 m.

An important item to solve is the fault detection of when a person is in contact with the power conductors such that the removal of power can be made immediately on those conductors so as to have a safe power distribution method. FIG. 3 shown below is a representative digital power transport system consisting of a power source and a load (this is a prior art method of power transmission and fault detection). This method monitors the decay time during the idle interval of a voltage on a capacitance. The decay time is determined by the RC time constant where the fault will highly dominate and control the value of R. Hence a slow decay time will represent a standard power transfer with no faults and a faster decay time will indicate that a fault is present. Note that the resistance $R_4$ in the FIG. 3 represents the distribution cabling's resistance and the resistance of a person if they are in contact with the power conductors. Hence $R_4$ can be fairly large (e.g., 1 MΩ)) if there is no fault from a person contacting the power wires and can be quite low (e.g., 1000Ω) if a person is contacting the power wires. During the "idle" period (when the transmitter is not sending power), both S1, S2, S3 and S4 are open and the cabling voltage is monitored at node 16. The voltage decays during this idle period, but at a rate corresponding to the RC time constant formed by R3, R4, and C1, C2. If there is no fault (i.e., no person is in contact with the power wires), the voltage will have a large decay time (see time period B in the FIG. 4A below). If on the other hand there is a fault, the decay time will be significantly reduced (see time period D in the FIG. 4A below). A threshold must be set so that one can distinguish between the two periods B and D. This method can detect when a person is contacting the power conductors within $T_{detect}$ seconds. The worst case maximum time $T_{detect}$ is equal to the sum of $T_{power}$ (the power transfer period A) and the sample period time $T_{idle}$ (where the fault is inserted approximately midway into the idle period such that it is not detected by the end of that period). FIG. 3 is a block circuit diagram of a power distribution system that utilizes fast fault detection technique to ensure power distribution is safe. Additionally, the schematic implements a data communication scheme to establish control communication between source and load. FIG. 4B is a time domain view of the different functions that take place with respect to time. During cycle A (and C) the power is transferred from the source (via closure of $S_1$ at time 31) to the load for a duration of time. During cycle B (and D), the power is removed (via opening of $S_1$ at time 33) and the distribution wiring is monitored to detect a fault. In a normal cycle (B), the voltage falls according to an RC time constant (R represented by $R_3$ and in case of a fault by the parallel combination of $R_3$ & $R_4$, and C represented by the wiring capacitance $C_1$ and the loads capacitance $C_2$). In a fault cycle (D), the voltage falls faster due to the reduced resistance due to the application of R4 (the fault resistance). Switches $S_2$ & $S_3$ (in the source) are used to transmit information to the load while switch $S_4$ (in the load) is used to transmit information from the load to the source.

Another important feature of this technique of power distribution is a communication method such that the transmitter can talk with the receiver and the receiver can talk with the transmitter. In FIG. 4B above, switches S2 or S3 on the transmitter side and S4 on the receiver side provide a half-duplex method of communication. The communication occurs during the idle period as shown in FIG. 4B (time periods B and or D). FIG. 4B shows the data communication during an idle period 30. FIG. 4B is a time domain view of the pulsed power distribution technique providing different functions (power transfer to the load, idle period with data communications) that take place with respect to time. The transmitter to receiver communications works as follows: during the idle period as the voltage is discharging, if S2 switch is closed (this circuitry behaves as a pull up circuit) the voltage will begin to rise (hence charge the capacitance) forming a logic 1. If the S2 switch remains open the voltage continues to follow the discharge curve forming a logic zero 32. If S3 is used rather than $S_1$, the S3 circuitry forms a pull-down circuit and a logic one perhaps is when the discharge curve does not change and the logic zero is when the discharge curve is accelerated (as S3 is enabled).

The receiver to transmitter communication works as follows: The transmitter places S2 (a pull up circuit) and the receiver Switch S4 behaves as a pull-down circuit and hence can accelerate the discharge curve. The logic one or zero is analogous as the S3 switch is used in transmitter to receiver communication. A cycle of transmitter to receiver communication is performed in one idle cycle and in alternate idle cycles the receiver to transmitter communication is performed.

SUMMARY OF THE INVENTION

A method of detecting a fault in a power distribution system includes placing a signal on the system at a frequency $F_1$ and then detecting a change in the signal due to a change in the impedance of the system as a result of a fault wherein the change is one of a change in phase, a change in signal tone, or a change in voltage level at the load. In one embodiment, band reject filters can be used to diminish the signal at the load or source. In another embodiment, the power source can be a periodic pulsed power source and the signal can be placed on the system during an idle phase of the periodic pulsed power.

DETAILED DESCRIPTION OF THE INVENTION

Figure 1A:
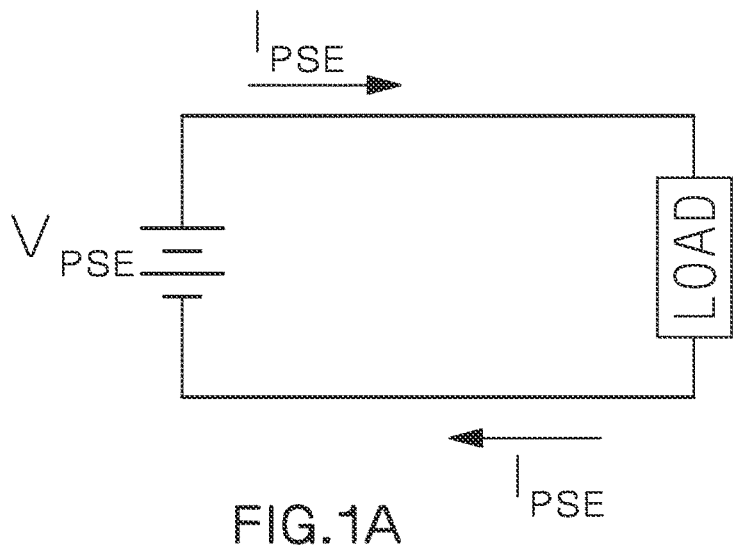
FIG. 1A is a circuit diagram of an exemplary pulsed power distribution system.
Figure 1B:
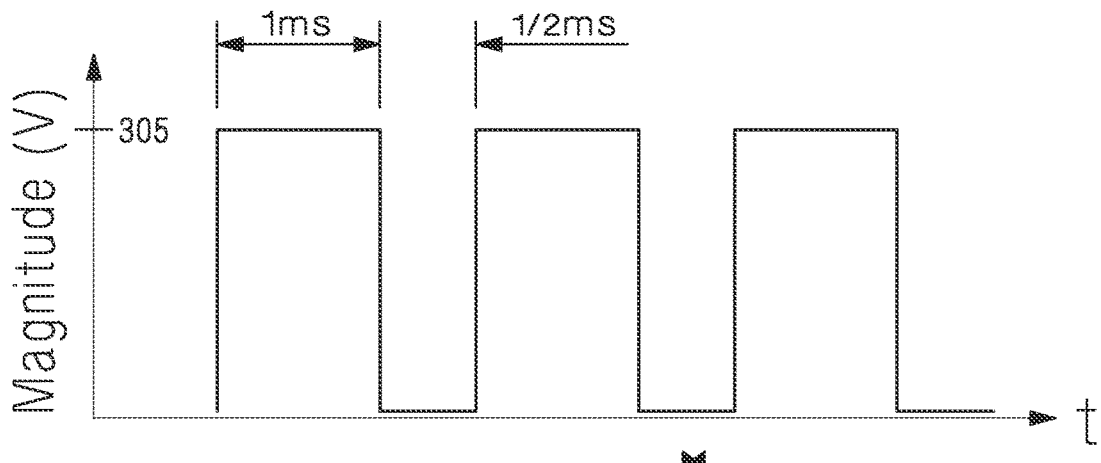
FIG. 1B is a time domain view graph representing a magnitude (in voltage) over a time duration of the pulsed power that is provided by the pulsed power distribution system.
Figure 1C:
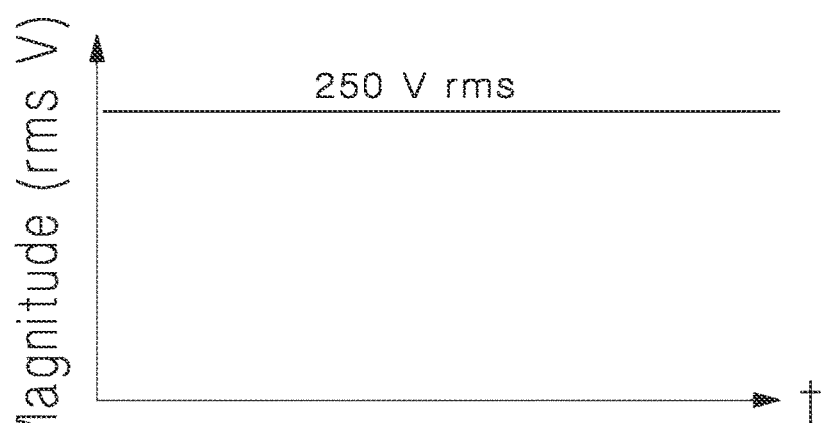
FIG. 1C is a time domain view graph representing an equivalent DC power delivered to a load by the pulsed power distribution system.
Figure 2:
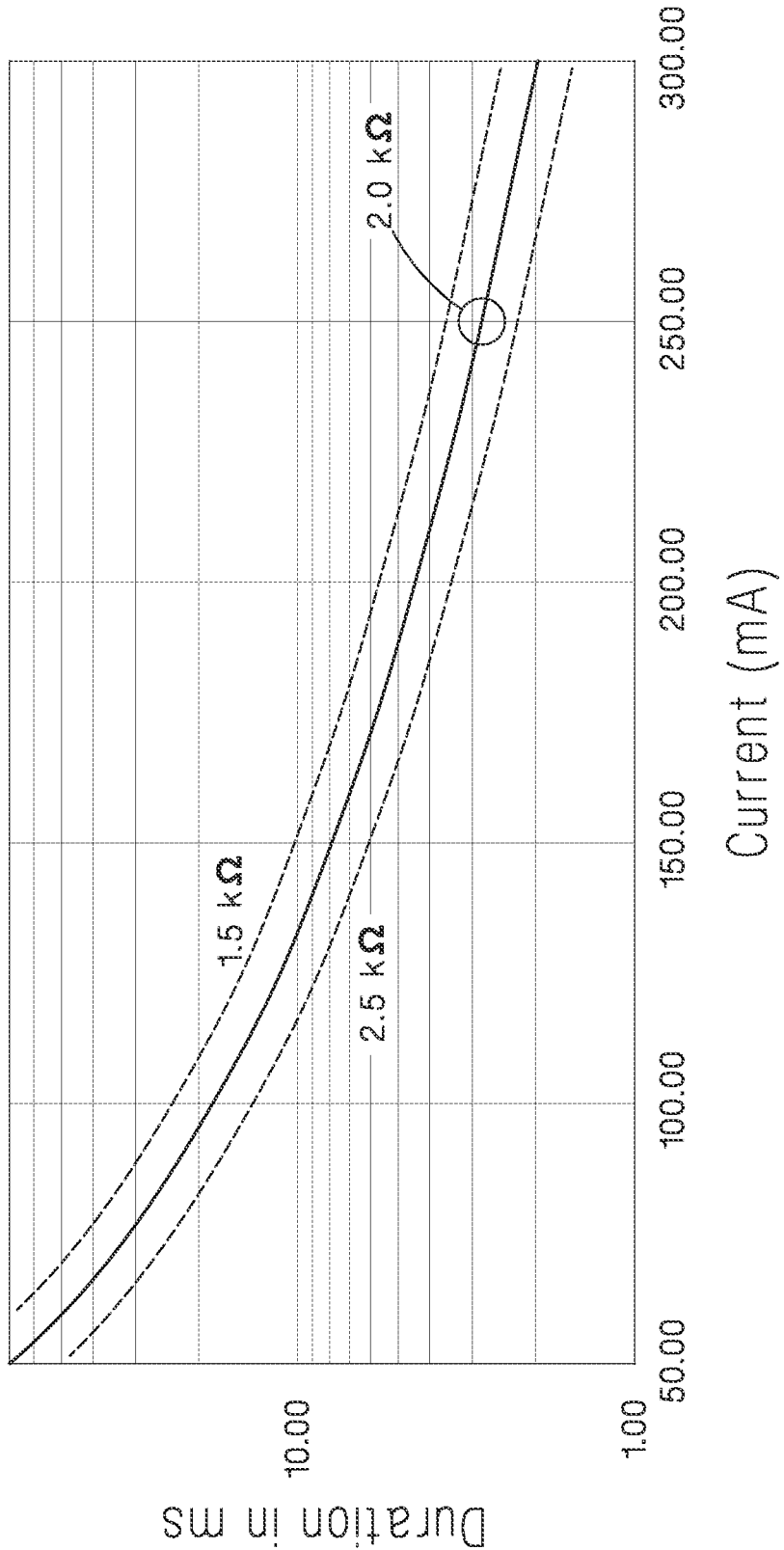
FIG. 2 is a time domain view graph representing a maximum exposure time of a power fault to a human body.
Figure 3:
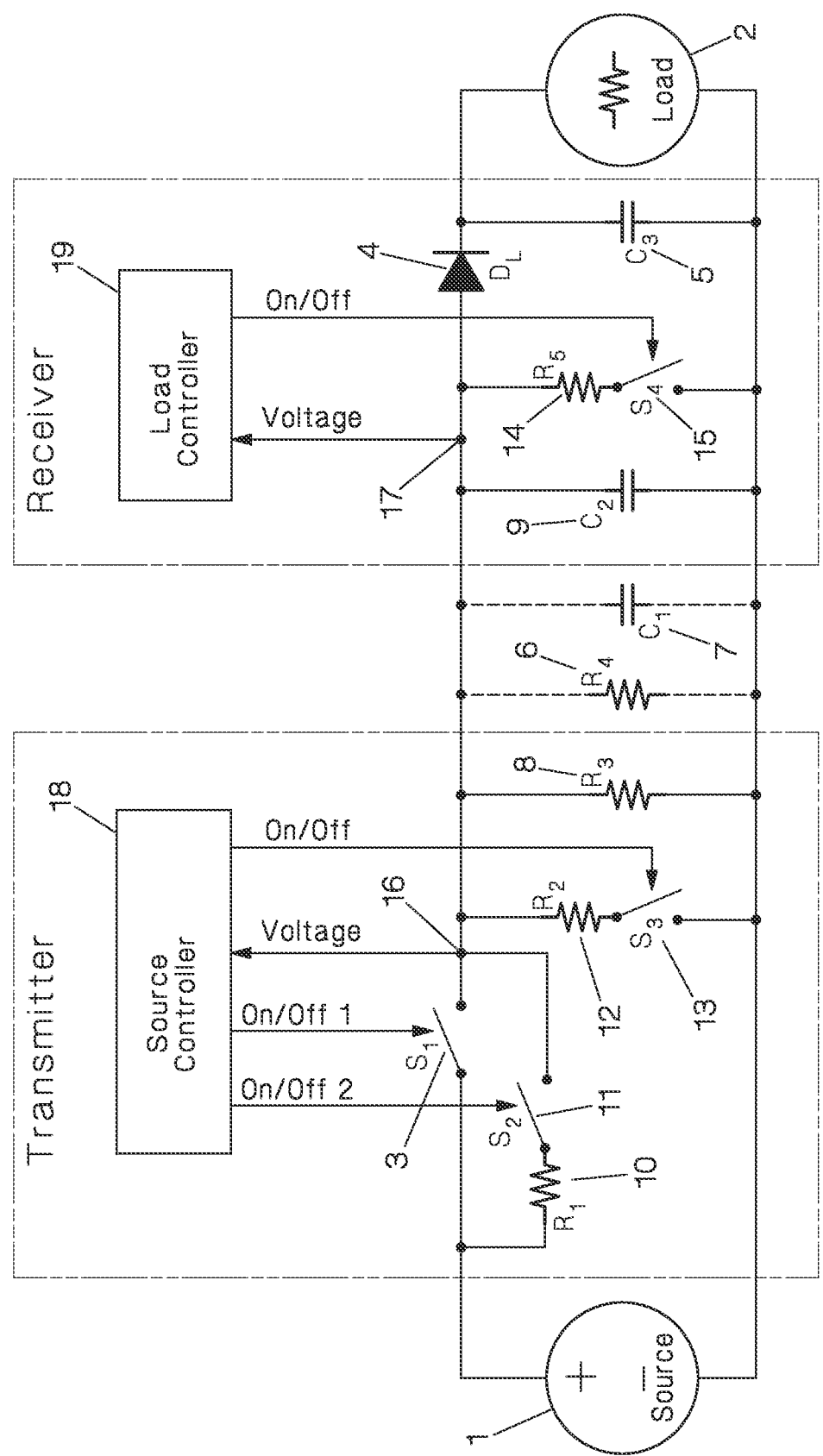
FIG. 3 is a circuit diagram of an exemplary pulsed power distribution system that uses fault detection.
Figure 4A:
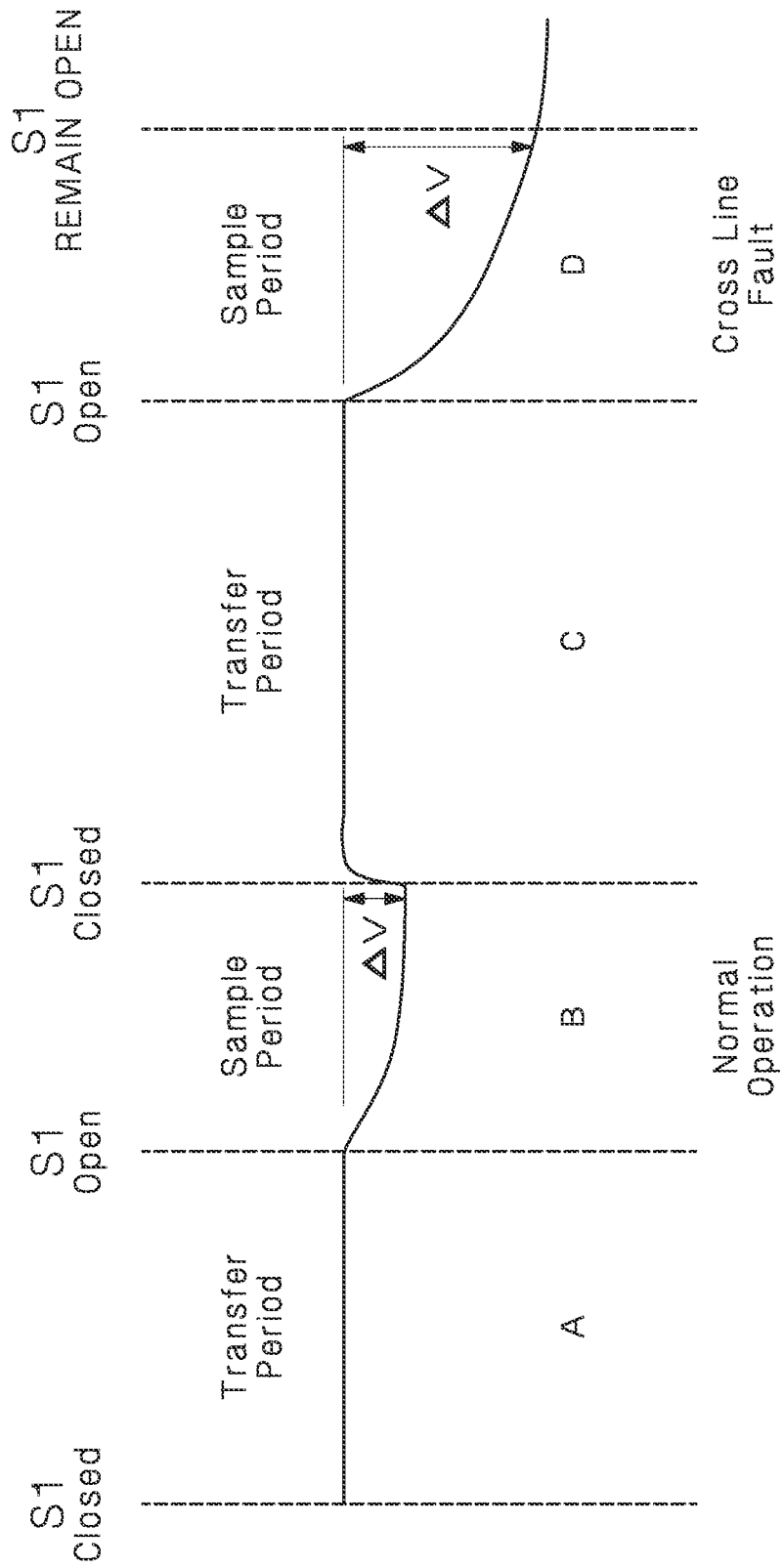
FIG. 4A is a time domain view of the pulsed power distribution technique providing different functions that take place with respect to time.
Figure 4B:
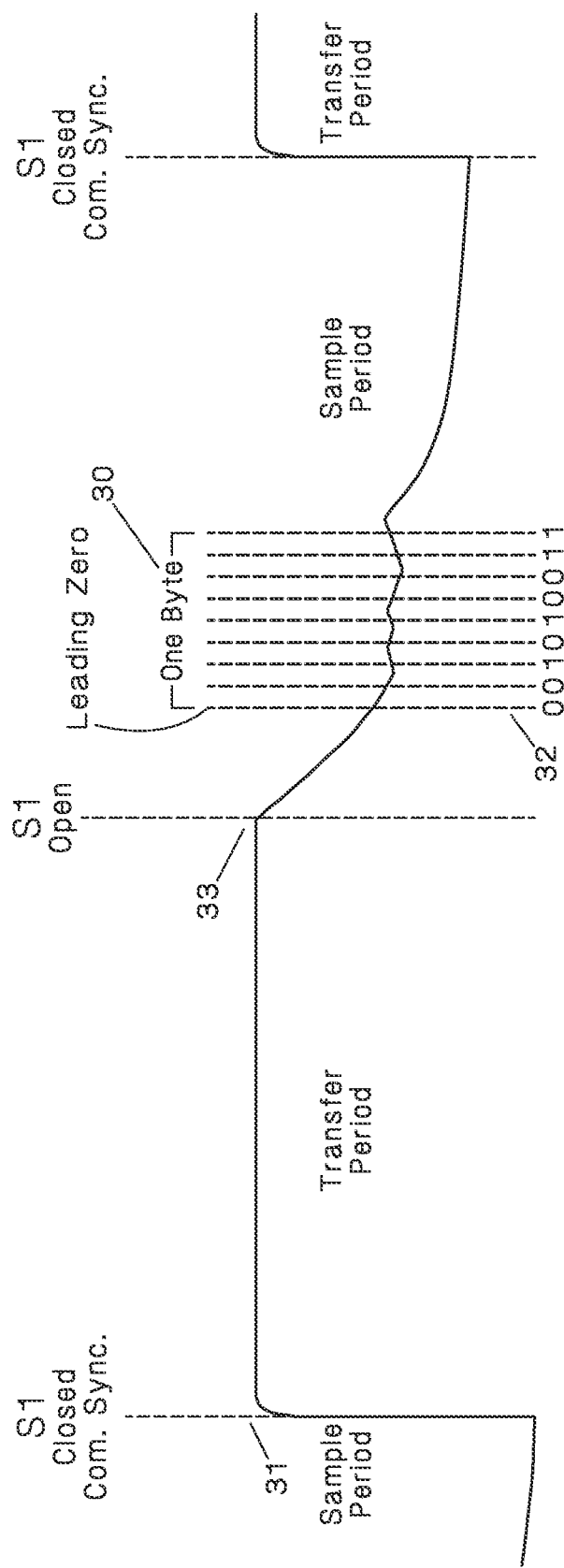
FIG. 4B is a time domain view of the pulsed power distribution technique providing different functions that take place with respect to time.
Figure 5A:
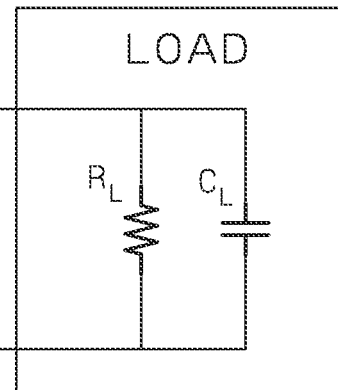
FIG. 5A is a representative circuit diagram schematic of the load in a power distribution system without a fault.
Figure 5B:
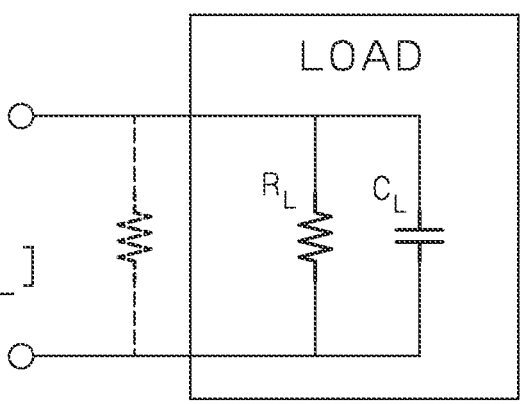
FIG. 5B is a representative circuit diagram schematic of the load in a power distribution system with a fault.
Figure 5C:
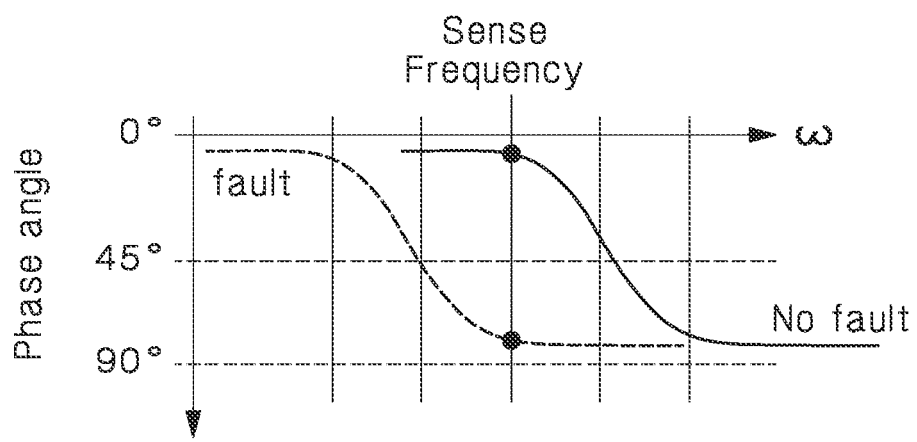
FIG. 5C is a time domain view mapping a phase as a function of frequency for a power distribution system.
Figure 6:
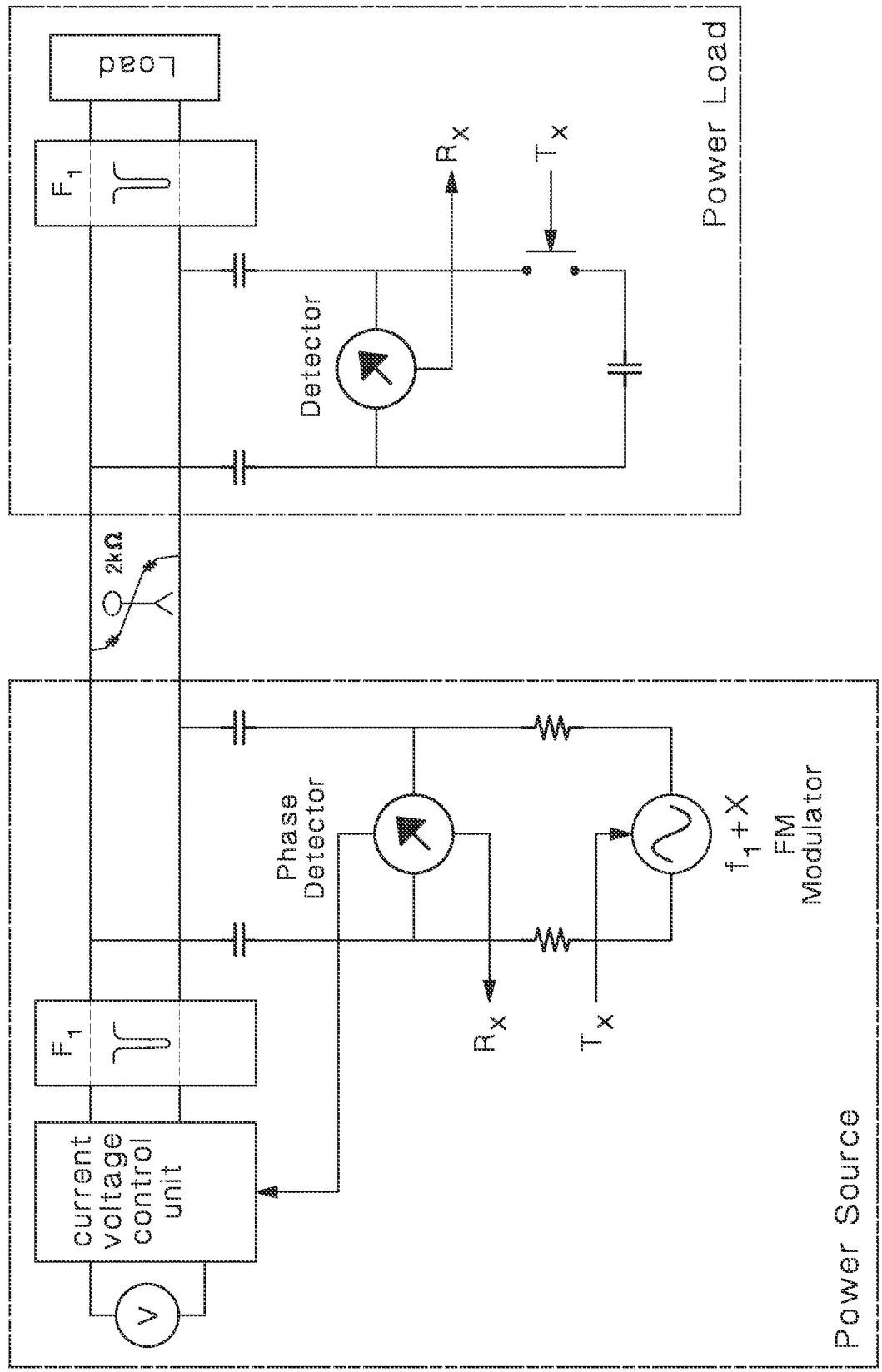
FIG. 6 is a block diagram of a power distribution system with fault detection and bidirectional communication capability.

The present invention involves several methods of detecting a change in a test signal due to a change in impedance as a result of a fault in the system. FIGS. 5, 6, and 7 show a first technique for fault detection. This technique is a continuous method of scanning to determine whether a fault is present. The method relies on the phase change at a particular frequency that occurs when the resistance (where the fault lowers the value of the resistance) of an RC circuit changes. FIG. 5A is a representative schematic of the load in a power distribution system without a fault, and FIG. 5B is a representative schematic of the load in a power distribution system with a fault. The phase response spectra of the load with and without the fault is shown in FIG. 5C. FIGS. 5A-5C disclosed below describes how the phase changes when the resistance is lowered. FIG. 5A shows the impedance and the phase of an RC circuit when no-fault is present. FIG. 5B shows the impedance and the phase of an RC circuit when the fault is present (and hence the phase is lowered due to the lower resistance). FIG. 5C shows the phase change that will occur when sampling at the "sense-frequency". The sense-frequency should be set at the point of maximum phase change in order to get a strong signal.

A schematic of a power distribution system that incorporates this detection method is shown below in FIG. 6. FIG. 6 is a block diagram of a power distribution system with fault detection and bidirectional communication capability. The $F_1$ Block in both the source and load represents a band reject filter at the frequency of $F_1$. Hence at the frequency of $F_1$, the impedance as seen looking into this block (using the person stick figure as a reference) is very high and does not pass through to the source or load. If a fault condition occurs (via a person in contact with both wires), the phase change (from normal to fault condition) will be detected (by the phase detector) and the power will be turned off for a period of time. Data communication from the source to the load utilizing 2-tone communications. Data communications from the load to the source is accomplished by the load varying the capacitive load and the source detecting the phase change. Note that this technique can work in both the idle period and the power transfer period (as long as a band reject filter at the sense-frequency is applied in front of the power source and the load).

Figure 7A:
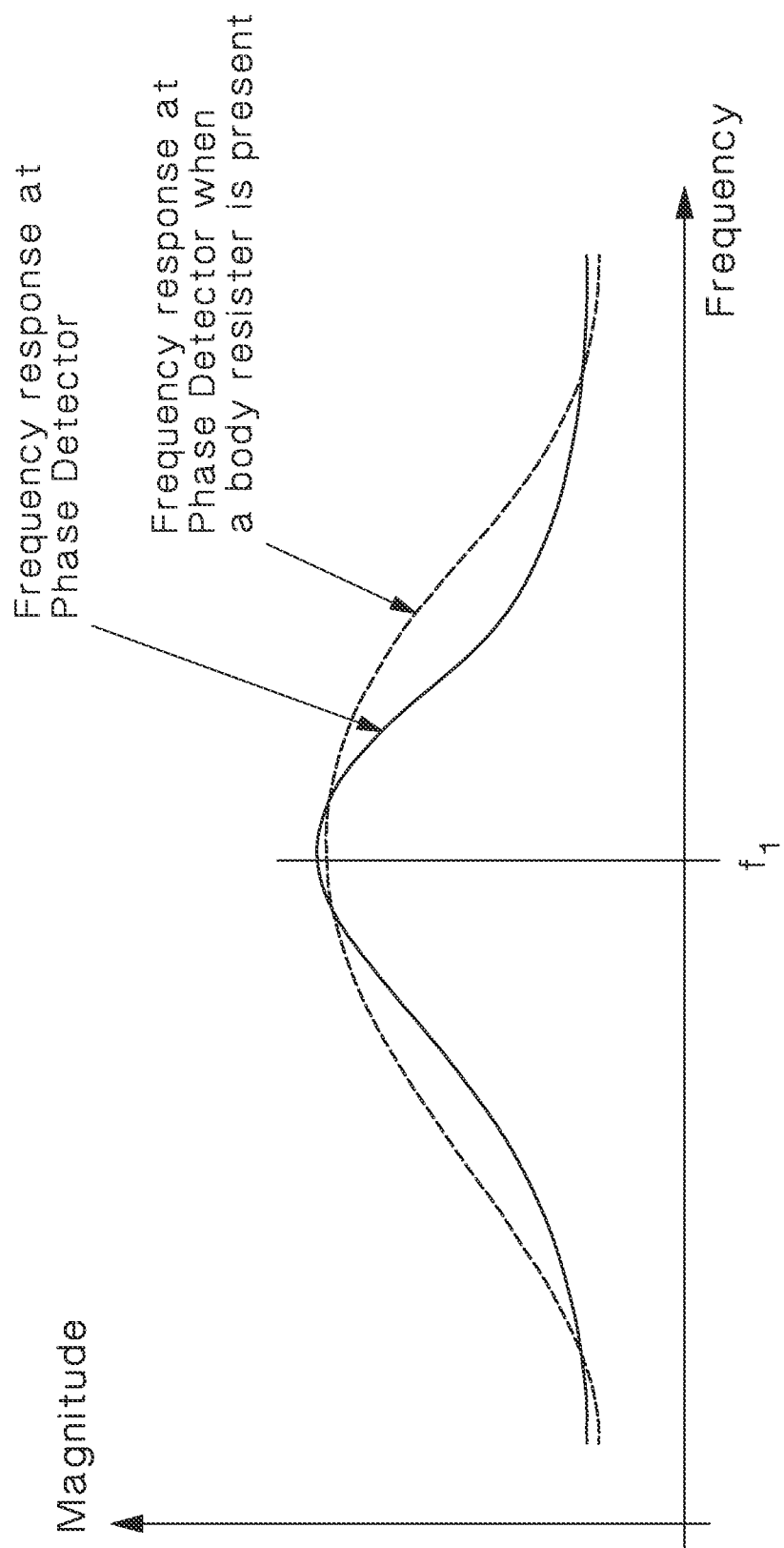
FIG. 7A is a magnitude and phase frequency response centered about the frequency $F_1$, with a fault present.
Figure 7B:
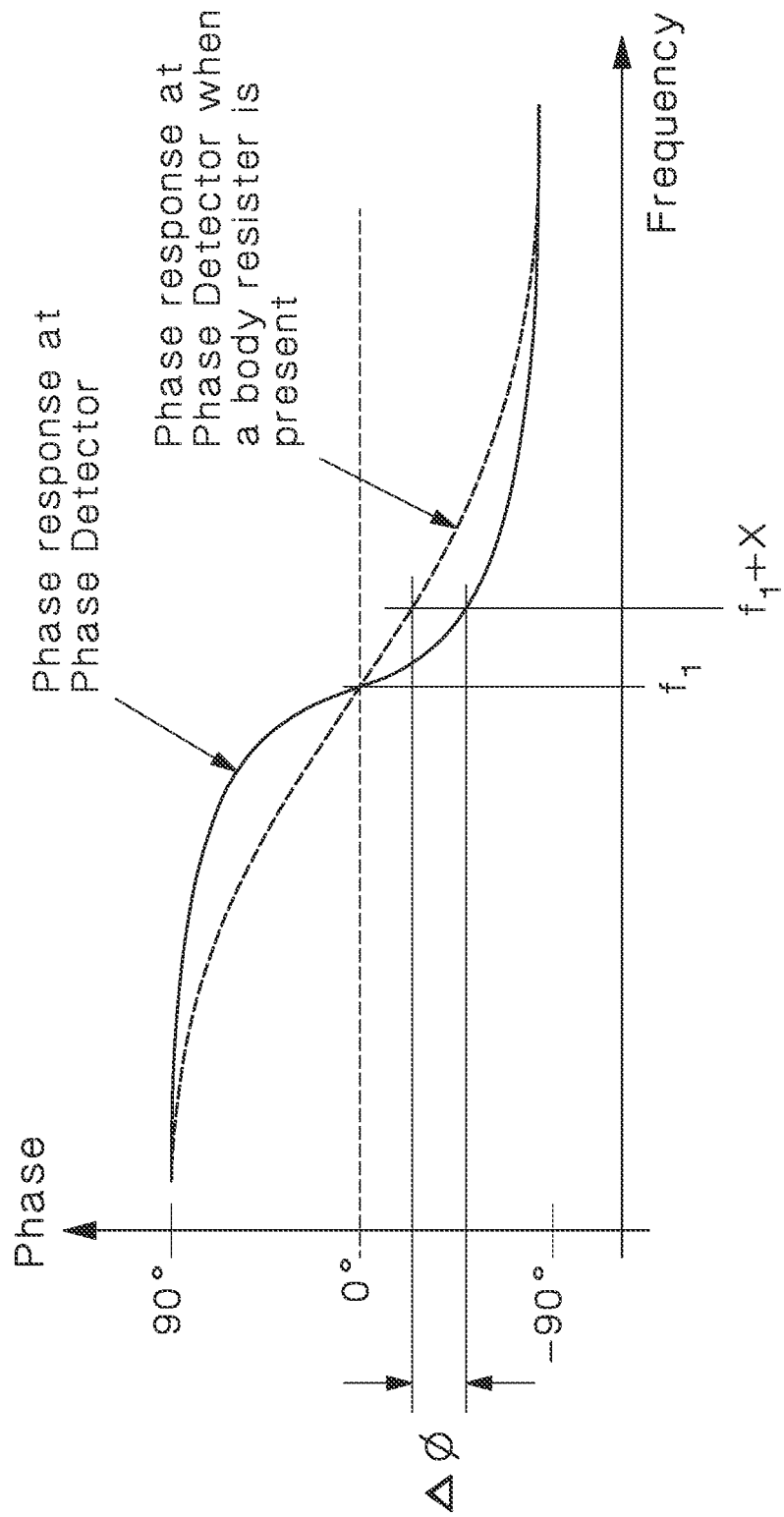
FIG. 7B is a magnitude and phase frequency response centered about the frequency $F_1$, without a fault present.

FIG. 7A-7B shown below shows the magnitude and phase spectra of a power distribution system using the phase shift technique. FIG. 7A is a magnitude and phase frequency response centered about the frequency $F_1$, with a fault present. FIG. 7B is a magnitude and phase frequency response centered about the frequency $F_1$, without a fault present.

Data communication can be accomplished as follows. In order to communicate from the transmitter to the receiver, the oscillator in the transmitter can transmit two frequencies (one for a logic one and another frequency for a logic zero). This technique is referred to as a two-tone communication system. The receiver simply detects these tones. In order to communicate from the receiver to the transmitter, the receiver can either employ the two-tone system or change the load characteristic at a particular frequency such that the transmitter can detect these load characteristic changes.

Figure 8:
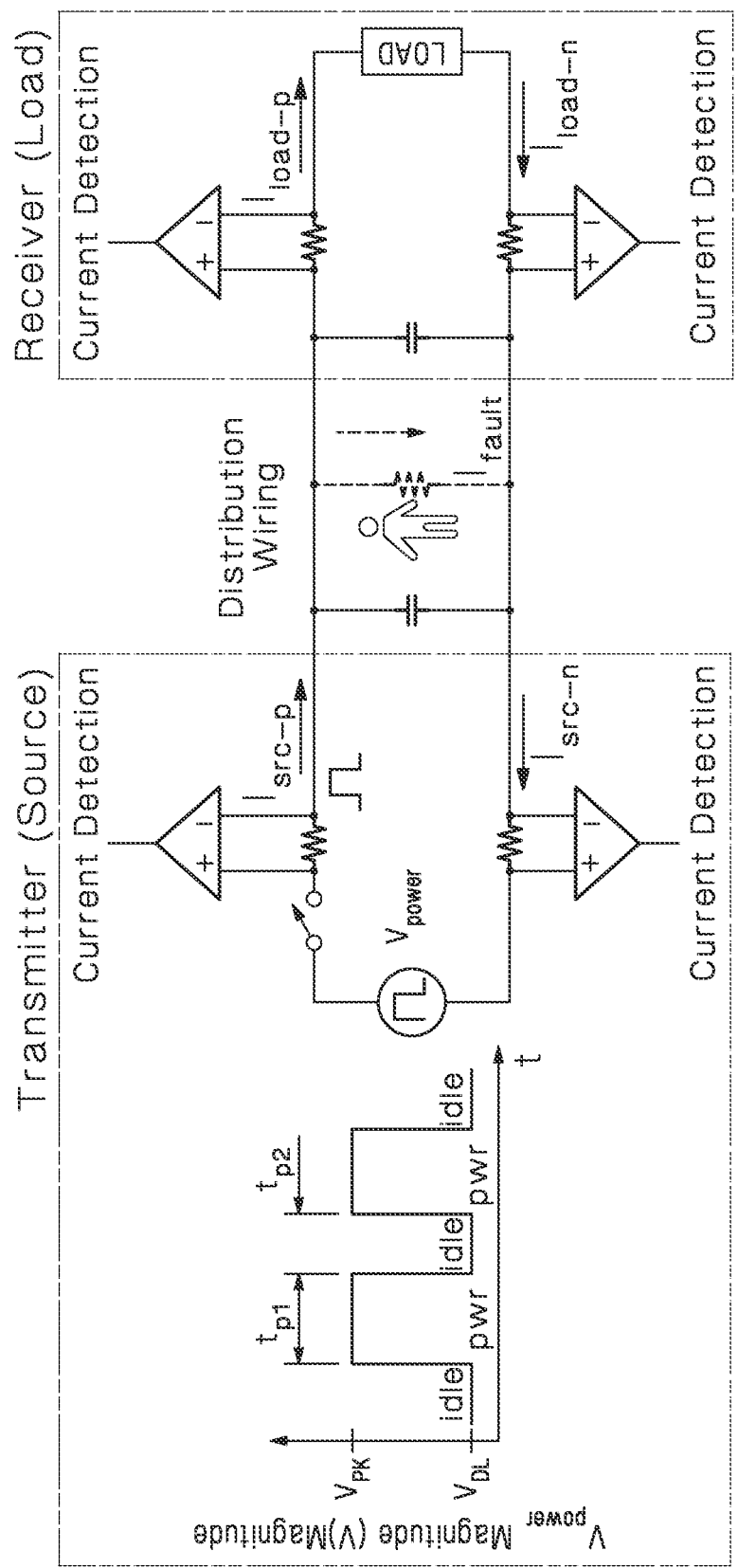
FIG. 8 is a block diagram of another type of a pulsed power distribution system with fault detection utilizing current measurement at the source and at the load.

FIG. 8 shows a second technique for fault detection. This technique is a continuous method of scanning to determine whether a fault is present and is described in FIG. 8 shown below. This method relies on two (one from the transmitter and one from the receiver) of the four shown current measurements ($I_{src-p}$ & $I_{load-p}$ or $I_{src-n}$ & $I_{load-n}$ or $I_{src-p}$ & $I_{load-n}$ or $I_{src-n}$ & $I_{load-p}$) and a communication technique between the receiver and the transmitter. The technique works by determining the magnitude of the fault current $I_{fault}$ by subtracting the two measured currents. The transmitter must receive the measured current from the receiver side in order to perform the current subtraction and if the calculated fault current is high enough the power source in the transmitter is opened to prevent injury. The communication technique can be the two-tone method described in method #1. FIG. 8 shows a block diagram of another type of a pulsed power distribution system with fault detection utilizing current measurement at the source and at the load. Note that if there is a fault, the fault current will cause the current Isrc-p and Isrc-n to increase while not effecting the currents (load-p nor (load-n. Hence monitoring one of the currents in the source and one in the load will be sufficient in determining whether a fault has occurred. The fault detection determination can occur during the power or the idle cycle. Also note that the pulsed power during the idle time does not have to go to zero, instead it could go to a lower continuously safe level (e.g., 60 VDC).

Figure 9:
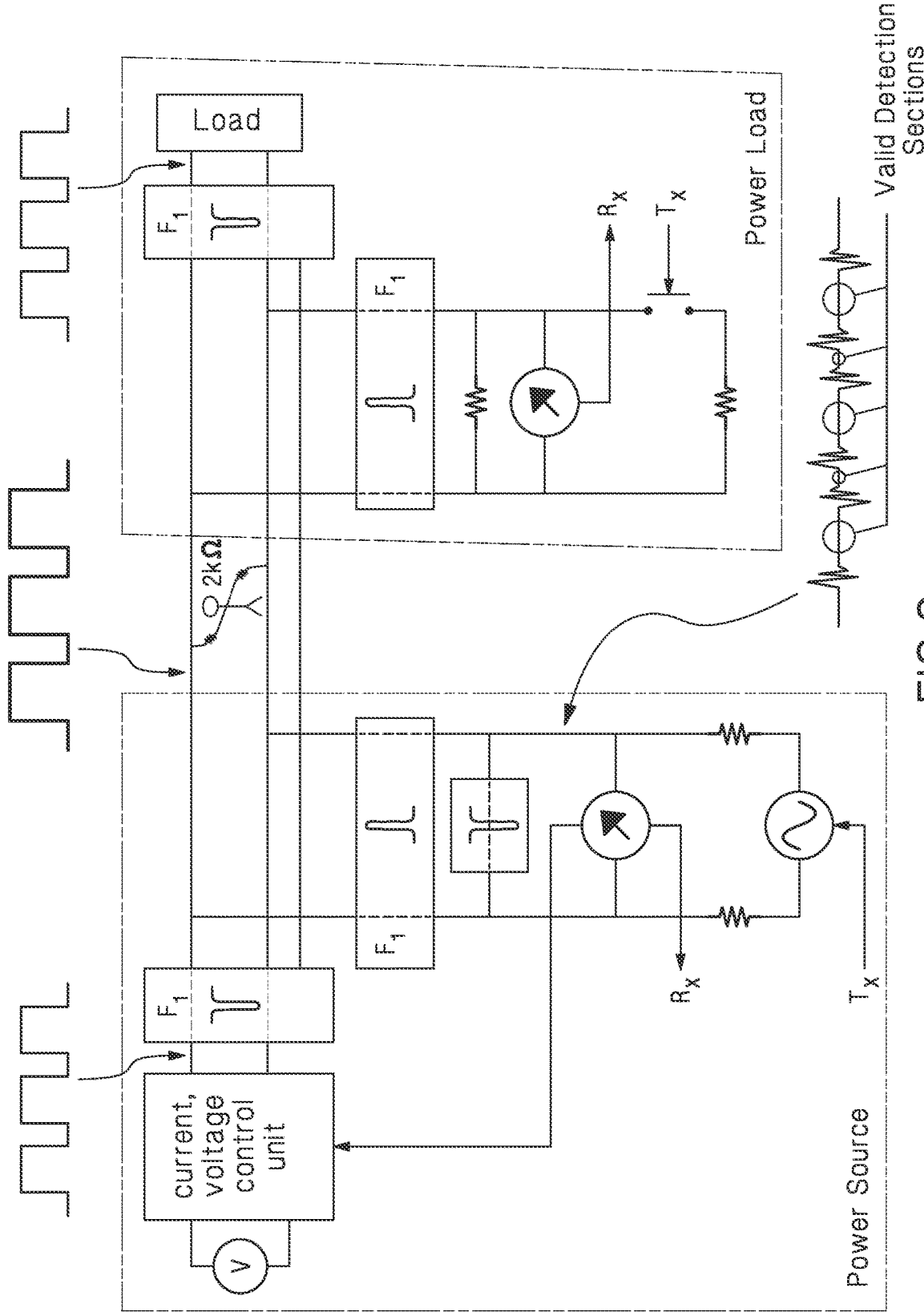
FIG. 9 is a block diagram of another type of a pulsed power distribution system with fault detection utilizing impedance measurement at the source.

FIG. 9 shows a third technique for fault detection. This technique is a continuous method of scanning to determine whether a fault is present and is described in FIG. 9 shown below. This method relies on a signal-tone that is transmitted towards the receiver. The magnitude of the signal-tone will depend on if the fault is present or not. If the fault is not present, the impedance as seen by the signal-tone is very high due to the notch filters centered at the tone frequency. If a fault is present, the impedance as seen by the signal-tone will be lower and hence detectable within the transmitter circuitry.

The communication technique can be the two-tone method described in method #1. FIG. 9 is a block diagram of another type of a pulsed power distribution system with fault detection utilizing impedance measurement at the source. The impedance measurement is made at a frequency F1 during the power or idle cycle (outside of the transition areas of the pulsed power waveform). The additional notch filter shown in the source block is centered at the pulsed power switching frequency to provide additional attenuation of the frequencies induced from the switching edges. Data communication from the source to the load utilizing 2-tone communications. Data communications from the load to the source is accomplished by the load varying the resistive load and the source detecting this impedance change.

Figure 10:
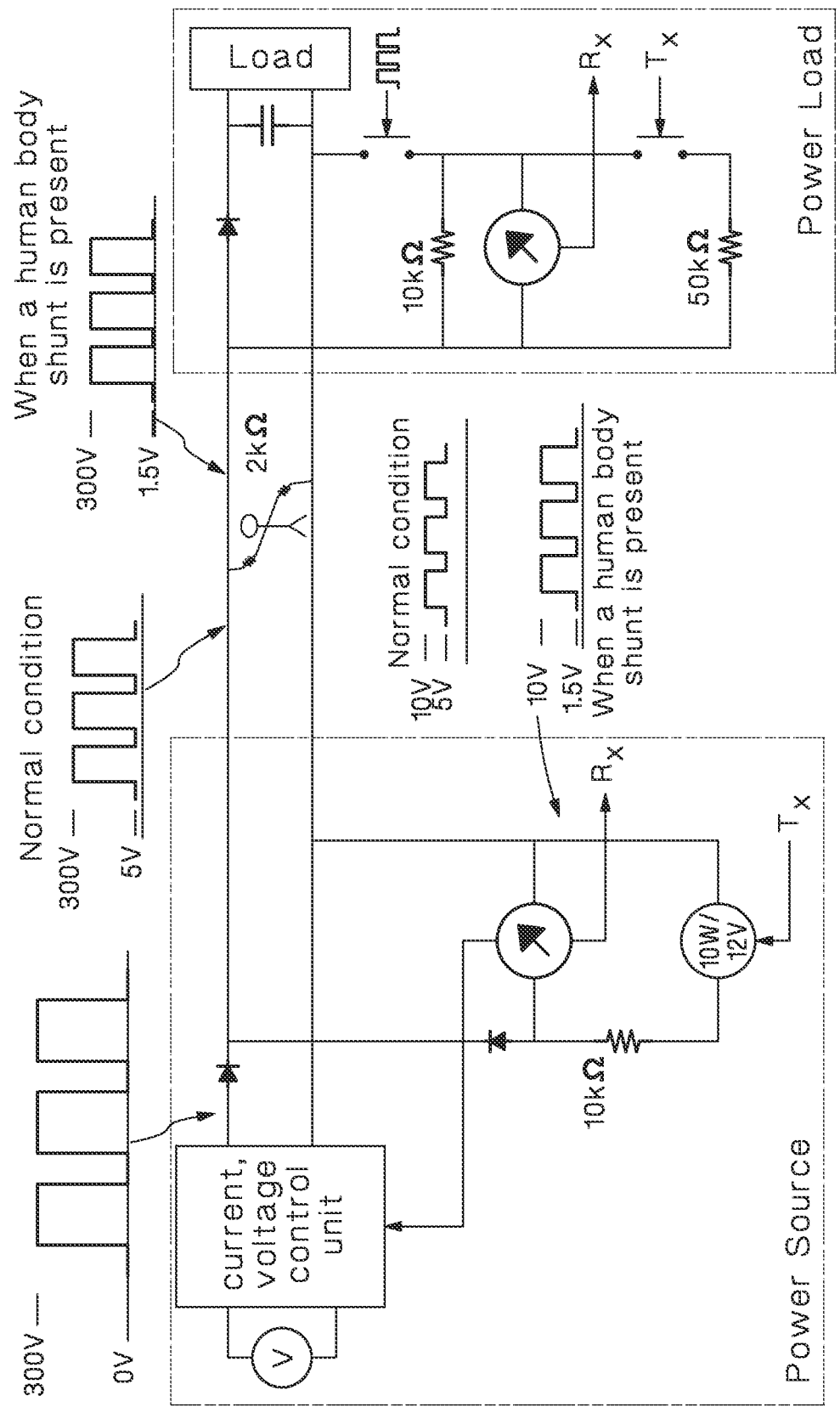
FIG. 10 is a block diagram of another type of a pulsed power distribution system with fault detection utilizing amplitude attenuation detection method.

FIG. 10 shows a fourth method of fault detection. This technique is a method of fault scanning to determine whether a fault is present and is described in FIG. 10 shown below. The detection of a fault is determined during the idle portion of the periodic pulsed power waveform. During this interval, a 10 V periodic pulsed signal is applied. Under normal conditions, the 10V peak voltage at the source gets voltage divided down to 5V at the load. If a fault is present, this 5V at the load will be reduced down to approximately 1.5V (due to the 2 k Ω) presence of the fault). This reduction from 5V to 1.5V can be detected in the power source equipment and appropriately keeps the power off. The power should stay off for a period of time that is determined to be a safe interval, and then return to a normal state.

Data communication can be accomplished in this method as follows. In order to communicate from the transmitter (power source) to the receiver (load), a data signal from the source operating from 10-12V is used in a pulse width modulation (or pulse coded modulation) scheme. The load would have the 50 k Ω) resistor switched in during source to load communication. In order to communicate from the receiver (load) to the transmitter (source), the 50 k Ω) resistor is turned on and off to create a pulse width (or pulse code) modulated signal. Here the source would detect the amplitudes between 5 and 4 volts (here the transmitter is injecting a constant 10 volts). Of course, this is just one way of providing a communication channel between the source and the load, there are many other ways of implementing this. FIG. 10 is a block diagram of another type of a pulsed power distribution system with fault detection utilizing amplitude attenuation detection method. During the idle portion of the pulsed power waveform, the 10V supply is being modulated by the load resistance. Under normal conditions the minimum of the periodic signal is ½ of the 10V power supply (5V) and under a fault, the minimum voltage drops to data communication from the source to the load utilizing the 10-volt pulsed waveform (e.g., number of pulses modulation, pulse width modulation, pulse code modulation, . . . ). Data communications from the load to the source is accomplished by the load varying the resistive load and the source detecting this amplitude change.

What is claimed is:

1. A method of detecting a fault in a power distribution system, the method comprising:
   providing a power source;
   controlling the power source to provide power in a form of periodic pulsed power;
   providing a transmission line connecting the power source to a load;
   placing a current source on the transmission line, wherein the current source provides a current within the power distribution system;
   continuously scanning the transmission line to detect a change on the transmission line indicative of a change in the power distribution system; and
   determining a fault is present within the power distribution system based on the detected change on the transmission line.

2. The method of claim 1, wherein determining the fault is present within the power distribution system comprises determining the fault is present when a detected voltage amount on the transmission line is lower than a predetermined safe voltage amount.

3. The method of claim 1, wherein determining the fault is present within the power distribution system comprises determining the fault is present when a detected voltage amount is higher than a predetermined safe voltage amount.

4. The method of claim 1, wherein the current source provides a low current within the power distribution system at least when detecting the change on the transmission line.

5. The method of claim 1, further comprising:
   detecting for a change in a voltage on the transmission line during an idle cycle of the periodic pulsed power.

6. The method of claim 1, wherein the periodic pulsed power includes a high voltage of at least 300 V.

7. The method of claim 1, further comprising:
   controlling the power source to cease providing the periodic pulses of power to the load when a fault is determined to be present.

8. A power distribution system comprising:
   a power source configured to provide power in a form of periodic pulsed power;
   a transmission line connecting the power source to a load;
   a current source configured to provide a current within the power distribution system; and
   a detection circuitry configured to:
      continuously scan the transmission line to detect a change on the transmission line indicative of a change in the power distribution system; and
      determine a fault is present within the power distribution system based on the detected change on the transmission line.

9. The power distribution system of claim 8, wherein the detection circuitry is configured to determine the fault is present when a detected fault voltage amount on the transmission line is lower than a predetermined safe voltage amount.

10. The power distribution system of claim 8, wherein the detection circuitry is configured to determine the fault is present when a detected fault voltage amount on the transmission line is higher than a predetermined safe voltage amount.

11. The power distribution system of claim 8, wherein the current source is configured to provide a low current within the power distribution system at least when detecting the change on the transmission line.

12. The power distribution system of claim 8, wherein the detection circuitry is further configured to:
   detect for a change in a voltage on the transmission line during an idle cycle of the periodic pulsed power.

13. The power distribution system of claim 8, wherein the periodic pulsed power includes a high voltage of at least 300 V.

14. The power distribution system of claim 8, wherein the power source is further configured to:
   cease providing power to the load when a fault is determined to be present within the power distribution system.

15. A power source for use in a power distribution system, the power source comprising:
   a power supply configured to provide power in a form of periodic pulsed power;
   a control unit configured to:

control the power supply to provide the power to a load, wherein the load is coupled to the power source via a transmission line;

continuously scan the transmission line to detect a change on the transmission line indicative of a change in the power distribution system; and determine a fault is present within the power distribution system based on the detected change on the transmission line.

16. The power source of claim 15, wherein the control unit is configured to determine the fault is present when a detected fault voltage amount is lower than a predetermined safe voltage amount.

17. The power source of claim 15, wherein the control unit is configured to determine the fault is present when a detected fault voltage amount is higher than a predetermined safe voltage amount.

18. The power source of claim 15, wherein the periodic pulsed power includes a high voltage of at least 300 V.

19. The power source of claim 15, wherein the control unit is further configured to:

detect a change in a voltage on the transmission line during an idle cycle of the periodic pulse power.

20. The power source of claim 15, wherein the control unit is further configured to:

control the power supply to cease providing power to the load when a fault is determined to be present within the power distribution system.

* * * * *